(12) United States Patent
Kawauchi et al.

(10) Patent No.: US 6,545,392 B2
(45) Date of Patent: Apr. 8, 2003

(54) PACKAGE STRUCTURE FOR A PIEZOELECTRIC RESONATOR

(75) Inventors: Osamu Kawauchi, Shiojiri (JP); Hisashi Mikoshiba, Ina (JP); Mitsuru Nagai, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 09/781,443

(22) Filed: Feb. 13, 2001

(65) Prior Publication Data

US 2001/0022488 A1 Sep. 20, 2001

(30) Foreign Application Priority Data

Mar. 15, 2000  (JP) ........................................ 2000-072690
Sep. 25, 2000  (JP) ........................................ 2000-291178

(51) Int. Cl.$^7$ .......................................... H01L 41/053
(52) U.S. Cl. ...................................... 310/344; 310/348
(58) Field of Search ........................ 310/344, 348, 310/349, 352

(56) References Cited

U.S. PATENT DOCUMENTS

| | | | | |
|---|---|---|---|---|
| 3,805,098 A | * | 4/1974 | Carpenter et al. | 310/344 |
| 4,191,905 A | * | 3/1980 | Yasuda et al. | 29/25.35 |
| 4,266,156 A | * | 5/1981 | Kizaki | 310/317 |
| 4,362,961 A | * | 12/1982 | Gerber | 29/25.35 |
| 4,652,787 A | * | 3/1987 | Zingg | 310/344 |
| 5,841,217 A | * | 11/1998 | Kizaki et al. | 310/344 |

FOREIGN PATENT DOCUMENTS

| | | | | |
|---|---|---|---|---|
| GB | 2002955 A | * | 2/1979 | H03H/9/10 |
| JP | 52-35593 | * | 3/1977 | 310/344 |
| JP | 54-54594 | * | 4/1979 | 310/348 |
| JP | 54-124692 | * | 9/1979 | 310/344 |
| JP | 58-116329 | | 8/1983 | H03H/9/10 |
| JP | 9-186545 | | 7/1997 | H03H/9/19 |
| JP | 9-232903 | | 9/1997 | H03H/9/19 |
| JP | 11-214947 | | 8/1999 | H03H/9/02 |

* cited by examiner

Primary Examiner—Thomas M. Dougherty
(74) Attorney, Agent, or Firm—Oliff & Berridge, PLC

(57) ABSTRACT

A package structure for a piezoelectric resonator includes a base which has a shape of flat box and made of an insulating material, and a thin lid bonded to the upper side of the base. A tuning fork type quartz crystal resonator piece is mounted at its one end, that is its base end, on electrode pads provided on the mounting surface in a cantilever manner using conductive adhesive so that it is parallel to the mounting surface, and hermetically sealed in a package with the lid engaged therewith. Either one or both of the mounting surface of the base and the inner surface of the lid has a recess formed at the location adjacent to the free end of a tuning fork type quartz crystal resonator piece so that the free end does not touch the inside surfaces of the packages when the quartz crystal resonator piece is largely dislocated on external impact.

15 Claims, 4 Drawing Sheets

PACKAGE STRUCTURE FOR A PIEZOELECTRIC RESONATOR

BACKGROUND OF THE INVENTION

1. Field of Invention

The present invention relates to piezoelectric resonators which are mounted on the surface of an electronic appliance, especially to a package structure in which a piezoelectric resonator piece is mounted in a cantilever manner and hermetically sealed.

2. Description of Related Art

Piezoelectric resonators are extensively used as a clock source for electronic circuits in a variety of electronic appliances including information communication devices such as cellular phones and PHSs, OA appliances such as computers, and daily necessities such as electronic watches. Attempts are currently being made to produce smaller piezoelectric resonators in size and thickness according to the realized compactness and small thickness of electronic appliances, particularly those which are portable.

In general, surface mounting type piezoelectric resonators may include a piezoelectric resonator piece, for instance quartz crystal, which is supported with one end in a cantilever manner, enclosed in a package made of an insulating material such as ceramic, and hermetically sealed. FIG. 11 shows an embodiment of a surface mounting type quartz crystal resonator in which a tuning fork type quartz crystal resonator 4 is enclosed in a package 3 which consists of a flat, rectangular base 1 and a thin panel lid 2. The tuning fork type quartz crystal resonator 4 having excitation electrodes on its quartz surface is mounted in a cantilever manner in which a base end 4a having leading electrodes from the excitation electrodes is fixed to electrode pads 5 disposed on the inner bottom surface of the base 1 using conductive adhesive 6. Then, the lid 2 is engaged on top of the base 1 and hermetically sealed.

SUMMARY OF THE INVENTION

The conventional piezoelectric resonators described above have a problem with resistance to impact, resulting from their compactness and small thickness. For instance, Patent Publication H7-354228 discloses the structure of a piezoelectric resonator mounted in a cantilever manner in which one end of the piezoelectric resonator piece is fixed to one of two platforms which are disposed on the inner bottom of the package so as to face to each other, and the other free end is slightly spaced from the other platform. As a result, the distance between the upper surface of the piezoelectric resonator piece and the inner surface of the lid is reduced to less than a predetermined value. When the piezoelectric resonator piece is subject to an impact, such as a fall, the free end of the piezoelectric resonator piece will touch the upper end of the platform or the inner surface of the lid, suppressing its up and down movement and absorbing the shock, thereby improving its resistance to impact.

Patent Publication H10-23882 describes a structure where the package in which a piezoelectric resonator piece is supported in a cantilever manner has a slanted, inner bottom surface. The free end of the piezoelectric resonator piece is slightly spaced from the higher part of the slanted bottom surface. With this structure, external impact can be absorbed by the free end of the piezoelectric resonator piece touching the inner bottom surface of the package. Consequently, both the resistance to impact and a reduction in the thickness of the package can be realized.

The present inventors found that the free end 4b of the tuning fork type quartz crystal resonator 4 is largely dislocated upward or downward as is shown by the imaginary line 4' in FIG. 11 when the piezoelectric resonator is subject to a significant external impact such as a fall. Then, the free end 4b touches the inner surfaces of the package 3, that is the inner bottom surface of the base 1, or the inner surface of the lid 2, and loosens the corner material. This is the main cause of changing the mass of the tuning fork arms and consequently the frequency. The free end 4b of the piezoelectric resonator piece may be inclined upward or downward when its base end 4a is fixed onto the electrode pad 5. It is highly possible that the free end 4b hits the bottom surface of the base 1 upon the impact of a fall and breaks, particularly if it is inclined downward. The present invention is proposed at least based on the findings described above.

On the other hand, debris falling off of the arm tips of the tuning fork may become deposited on the tuning fork type quartz crystal resonator piece 4. This may cause frequency change and further deterioration in resonator properties. Therefore, the prior art obtains resistance to impact by mounting the piezoelectric resonator piece at a level distant from the inner bottom surface of the base and positioning the lid at a higher level, so that a large space is produced enough for the free end of the piezoelectric resonator to be dislocated upward or downward on impact without touching the inner surfaces of the package. However, this configuration results in increasing the total thickness of the piezoelectric resonator and does not satisfy the compactness and flatness requirements.

For piezoelectric resonators of the tuning fork type, frequencies are finally adjusted by partially fusing and removing the metal weight formed on the arm tips of the tuning fork using a laser beam emitted from an external source through a transparent glass lid after the piezoelectric resonator piece is sealed in a package. Compactness and flatness are realized by reducing the space between the piezoelectric resonator piece and the lid. Metal fusion by the laser beam is easily re-deposited on the tuning fork arms and affects the frequency, hampering the fine frequency adjustment.

An object of the present invention is, in response to the compactness and flatness requirements for surface mounting type piezoelectric resonators, to provide a package structure which at least has excellent resistance to impact without increasing the package thickness.

Another object of the present invention is to provide a package structure which allows at least fine frequency adjustment, particularly in piezoelectric resonators of the tuning fork type.

The package structure for a piezoelectric resonator according to various exemplary embodiments of the present invention consists of at least achieving the above described purposes. In accordance with various exemplary embodiments, a piezoelectric resonator piece is provided which is mounted in a cantilever manner and hermetically sealed in package structure in which the package consists of a base having a mounting surface provided with connection electrodes on which the piezoelectric resonator piece is mounted with one end in a cantilever manner using conductive adhesive, and a lid which is engaged with the upper part of the base. In these various exemplary embodiments, either one or both of the mounting surface of the base and the inner surface of the lid have a recess formed adjacent to the free end of the piezoelectric resonator piece.

With the above structure, the free end of the piezoelectric resonator piece does not touch the mounting surface of the base and/or the inner surface of the lid when it is largely dislocated upward or downward upon impact, from such as a fall. The factors which may cause frequencies to deviate from a predetermined range can be eliminated, such as tip fracture and tip debris depositing on the piezoelectric resonator piece. In addition, the space between the piezoelectric resonator piece and both the mounting surface of the base and the inner surface of the lid can be reduced. There is no need for the entire package to have a large thickness.

Particularly, piezoelectric resonators of tuning fork type can be advantageous because frequency fluctuation due to the mass change of the tuning fork arms is prevented. Furthermore, the accuracy of frequency is improved as a result of the fused metal splashes being deposited on the inside of the recess, not on the tuning arms when the metal weight is fused and removed to adjust the frequency by directing a laser beam onto the arm tips through a lid, made of, for instance, transparent glass, after the package is sealed. Impairment of the inner bottom surface of the recess by laser beams which have passed the tuning fork arms is prevented, because it is more distant from the focal point of the laser beam compared to the conventional way.

In an exemplary embodiment of the present invention, the recess formed on the mounting surface of the base has a slanted wall on the side closest to the connection electrodes. With this, the impact on the middle part of the piezoelectric resonator piece touching the recess edge is alleviated when it is largely dislocated upward or downward, and also an increased amount of dislocation can be accepted.

The recess can have a variety of shapes in its top view, such as rectangular, oval, or track (like an athletic sports track) in accordance with the free end of the piezoelectric resonator piece. The rectangular shape will allow a large surface area for the recess. The corners of the rectangular are preferably rounded so that the recess is easily processed and the package strength is improved as a result of alleviating the stress concentration on the corners, and preventing cracks in the course of forming a recess and assembling a piezoelectric resonator, as well as in its use. The oval shape improves the package strength by preventing the entire stress on the package from concentrating around the recess. The track shape will provide these two advantages by preventing the entire stress on the package from concentrating around the recess and allowing a large surface area.

It is preferable that a communication channel be provided in the recess formed on the mounting surface of the base during the last stage of manufacturing in order to vacuum the inside of the package, because this will make the package structure simple and reduce the number of production steps.

In order to greatly reduce the chance of breakage followed by frequency change of the piezoelectric resonator piece upon the impact of a fall, and also to realize the compactness and flatness of the package, it is convenient that the package structure be sized to satisfy the expressions: $0.5 < L1/L0 \leq 1$, wherein L0 is the distance between the fixed supporting point and the free end tip of the piezoelectric resonator piece mounted on the connection electrodes, and L1 is the distance between the fixed supporting point and the edge of the recess which is on the side closest to the connection electrodes; and $t2/t1 \geq 0.8$, wherein t1 is the height to the lid from the upper surface of the piezoelectric resonator piece, and t2 is the height to the piezoelectric resonator piece from the bottom surface of the recess.

DETAILED DESCRIPTION OF PREFERRED EMBODIMENTS

Figure 1:
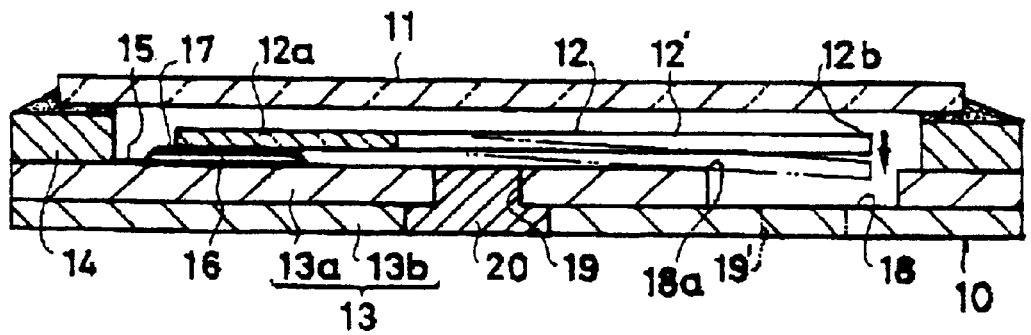
FIG. 1 is a vertical section of the piezoelectric resonator of a first exemplary embodiment according to the present invention.
Figure 2:
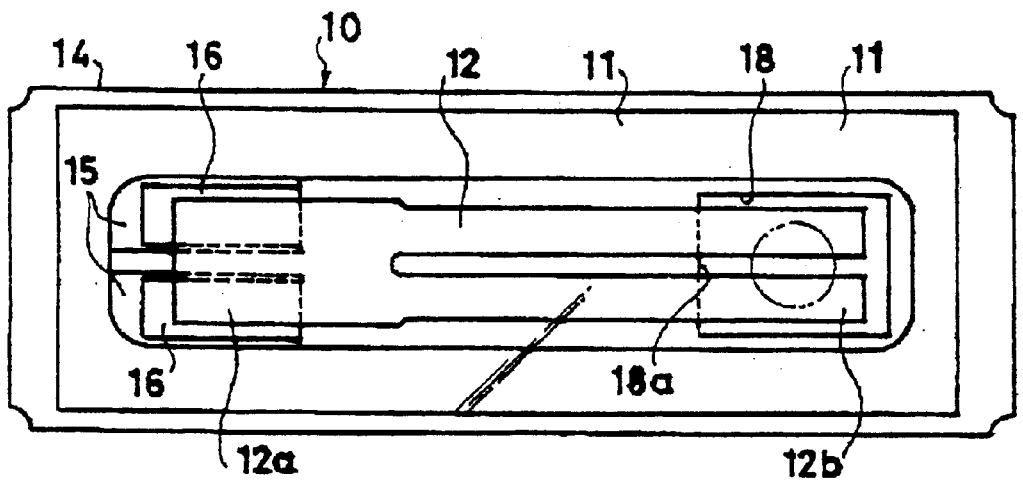
FIG. 2 is a top view of the piezoelectric resonator shown in FIG. 1.

FIGS. 1 and 2 show a first exemplary embodiment of the present invention, which contains the basic structure of a piezoelectric resonator according to the present invention. This piezoelectric resonator may include a quartz crystal resonator piece 12 of tuning fork type which is mounted in an cantilever manner in a package consisting of a flat, rectangular base 10 and a lid 11. The base 10 has a bottom part 13 which may include two laminated, nearly rectangular, thin plate members 13a and 13b made of an insulating material such as ceramics. A rectangular frame shape of wall member 14 is bonded to the upper surface of the bottom part 13. The lid 11 is made of a transparent thin glass plate or thin ceramics plate and bonded onto the upper end of the wall member 14 using, for instance, sealing glass or solder to hermetically seal the tuning fork type quartz crystal resonator piece 12 in the package.

Two conductive electrodes 15 are disposed on the upper surface of the bottom part 13 constituting a mounting surface for the tuning fork type quartz crystal resonator piece 12, to connect it to an external circuit. A pair of electrode pads 16 are provided as connection electrodes to the tuning fork type quartz crystal resonator piece 12 on the end of each conductive electrode which is exposed at one end of the base 10 inside. A base end 12a, which forms leading electrodes of the tuning fork type quartz crystal resonator piece 12, is bonded to the electrode pads 16 using conductive adhesive 17. In this way, the tuning fork type quartz crystal resonator piece is mounted in a cantilever manner, being slightly spaced from and nearly in parallel to the mounting surface. The conductive adhesive 17 can be a soft, silicone type adhesive which can absorb external impact due, for instance, to a fall.

A recess 18 which is rectangular in its top view is formed in the mounting surface inside the base 10, adjacent to the free end 12b or to the arm tips of the tuning fork type quartz crystal resonator piece 12. The recess 18 is easily formed by piercing the upper thin plate member 13a with a rectangular opening and bonding it to the lower thin plate member 13b, both plate members are to build the bottom part 13. A communication channel 19 is provided nearly at the center of the bottom part 13 and filled with filler 20 in order to vacuum the inside of the package during the final stage of manufacturing, after frequency adjustment.

With the recess 18 provided, when the tuning fork type quartz crystal resonator piece 12 is largely dislocated downward to the mounting surface, that is, toward the mounting surface as shown by imaginary line 12' in FIG. 1, the free end 12b comes inside the recess 18 and does not touch its bottom surface, with or without the middle part of the tuning fork type quartz crystal resonator piece 12 abutting the edge 18a of the recess which is on the side closest to the electrode pads 16. Breaking and falling off of the tips of the free end 12b and material deposits on the tuning fork type quartz crystal resonator piece are prevented, which would otherwise significantly affect the frequency. In addition, the middle surface of the tuning fork type quartz crystal resonator piece touches the edge 18a of the recess. This reduces the chance of the pieces breaking and falling off, which also results in reducing the affect on the frequency.

In the present embodiment, the frequency of the quartz crystal resonator is adjusted by removing a weight, such as Cr, Au, and Ag, formed on the free end 12b, that is, the tuning arm tips of the tuning fork type quartz crystal resonator piece 12 using a laser beam emitted from an external source through the lid 11 which is bonded to the base 10. Metal particles splashed from the weight mostly fall into the large recessed space below the arm tips of the tuning fork and deposit on the bottom and side surfaces of the recess. Very little metal can be redeposited on the tuning fork arms, allowing fine frequency adjustment. The upper surface of the bottom part 13 may have the risk of being impaired by a laser beam if it is close to the free end 12b. However, there is no such risk in the present embodiment because the depth of the recess 18 serves to defocus a laser beam.

In a modified version of this embodiment, a communication channel 19' is provided at the location of the recess 18 to vacuum the inside of the package, as is shown by the imaginary lines in FIG. 1. This allows the elimination of the step in which an opening is made in the upper thin plate member 13a, reducing the number of processing steps by 1.

Figure 3:
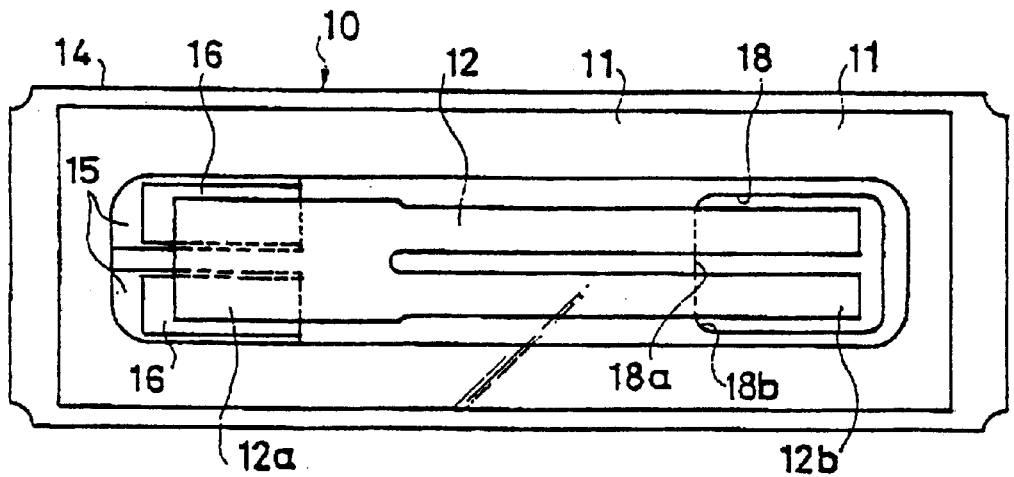
FIG. 3 is a top view of a modified version of the piezoelectric resonator of the first embodiment.

FIG. 3 shows a modified version of the tuning fork type quartz crystal resonator according to the first exemplary embodiment. This differs from the first embodiment in that each corner 18b of the rectangular recess 18 is rounded. This helps to modify the stress concentration on the corners in the course of forming the recess in the upper thin plate member 13a, which is made of relatively hard ceramic, and assembling the quartz crystal resonator, as well as in use. The recess 18 is formed more easily and the package strength is improved.

Figure 4:
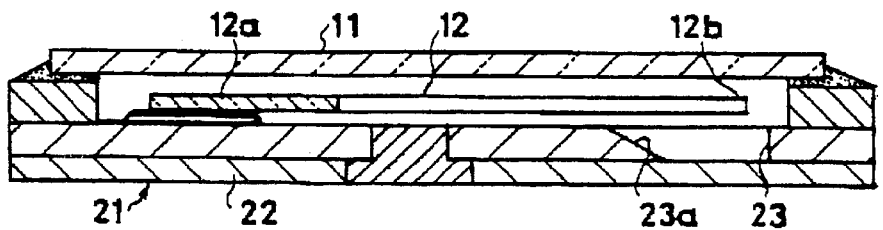
FIG. 4 is a vertical section of the piezoelectric resonator of a second exemplary embodiment according to the present invention.
Figure 5:
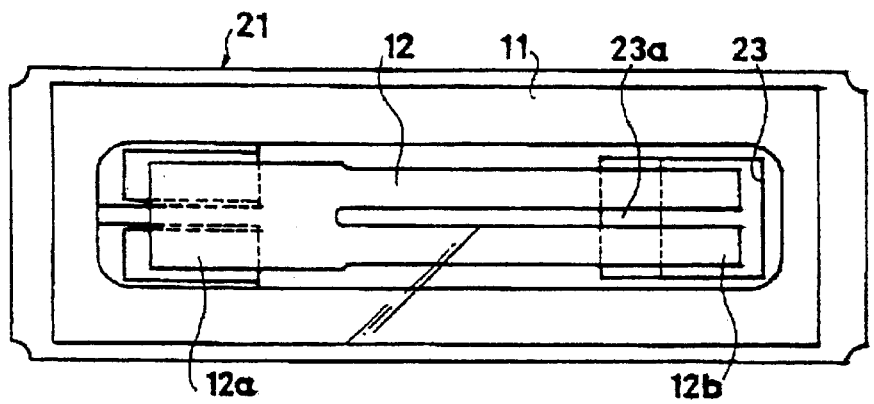
FIG. 5 is a top view of the piezoelectric resonator shown in FIG. 4.

FIGS. 4 and 5 show a second exemplary embodiment of the piezoelectric resonator according to the present invention. This piezoelectric resonator has nearly the same structure as the first embodiment. The same reference numbers are given to the same components and their explanations are omitted. As shown in FIGS. 4 and 5, a recess 23 is formed also in this embodiment on the upper surface of the bottom part 22 inside the base 21, which is made of an insulating material such as ceramic, at the location facing the free end 12b of the tuning fork type quartz crystal resonator piece 12. The recess 23 in this embodiment differs from that of the first embodiment in that the side wall 23a which is on the side closest to the electrode pads is slanted down to the recess bottom.

With this configuration, when the tuning fork type quartz crystal resonator piece 12 swings downward, its middle part touches the obtuse angled edge or slanted surface instead of the right angled edge as is in FIG. 1. This can alleviate the impact to a certain extent. The middle part of the tuning fork type quartz crystal resonator piece 12 which touches the edge of the recess 23 which is on the side closest to the electrode pads 16 is shifted to the base end, compared to the first embodiment. This allows the tuning fork type quartz crystal resonator piece 12 to dislocate more than in the first embodiment. There is still less risk of the free end 12b touching the inside surfaces of the package, and resistance to impact is improved.

Figure 6:
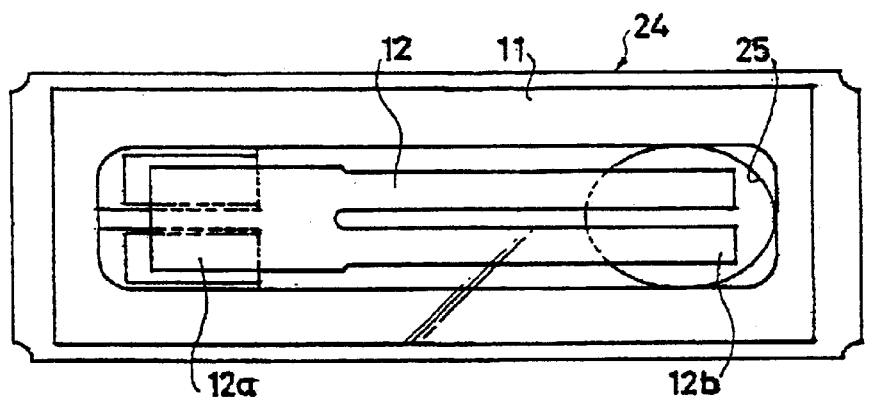
FIG. 6 is a top view of the piezoelectric resonator of a third exemplary embodiment according to the present invention.

The recesses 18 and 23 respectively in the bases 10 and 21 of the first and second embodiments are formed to be rectangular in their top view in order to obtain a large area. Other various profiles can be taken. A third exemplary embodiment of the present invention shown in FIG. 6 has, in its top view, an oval recess 25 in a base 24. In the first and second embodiments, the stress on the package tends to concentrate on each corner of the recess, while in the third embodiment, the stress concentration on the recess is modified, improving the package strength.

Figure 7:
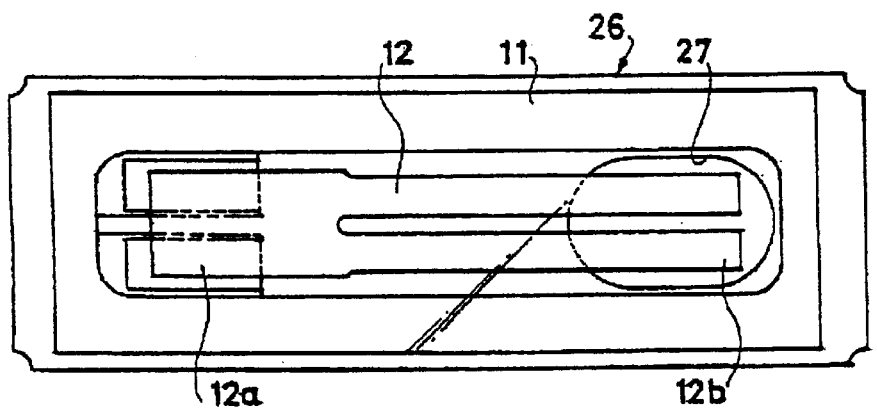
FIG. 7 is a top view of the piezoelectric resonator of a fourth exemplary embodiment according to the present invention.

A fourth exemplary embodiment shown in FIG. 7 has, in its top view, a track-like recess 27 in a base 26, in which two semicircular counterparts are connected to each other with a straight part like an athletic sports track. This configuration can combine the advantages of the first to third embodiments, in other words, the stress concentration on the package is modified while a large recess area is obtained.

Figure 8:
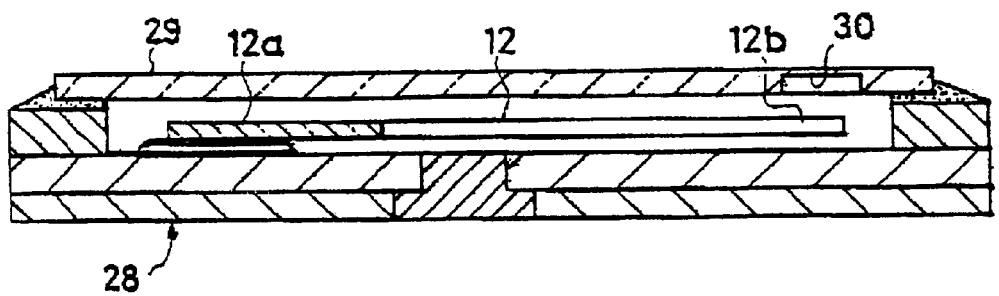
FIG. 8 is a vertical section of the piezoelectric resonator of a fifth exemplary embodiment according to the present invention.

FIG. 8 shows a fifth exemplary embodiment of the piezoelectric resonator according to the present invention. This embodiment differs from the embodiments described above in that a recess 30 is formed in the inner surface of the lid 29, not in the base 28 of the package. This prevents the free end 12b of the tuning fork type quartz crystal resonator piece 12 from touching the inner surface of the lid 29 when the end 12b is dislocated upward on impact. There is no risk of the tip breaking and falling off and the fallen materials being re-deposited on the quartz crystal resonator piece.

In another embodiment, the recesses shown in FIGS. 1 and 8 can be formed both in the base and lid which together consist of the package for a quartz crystal resonator piece. With this configuration, when the quartz crystal resonator piece is largely dislocated upward and downward, there is no risk of the free end touching the inner surfaces of the package, and significantly improved resistance to impact is obtained.

Figure 9A:
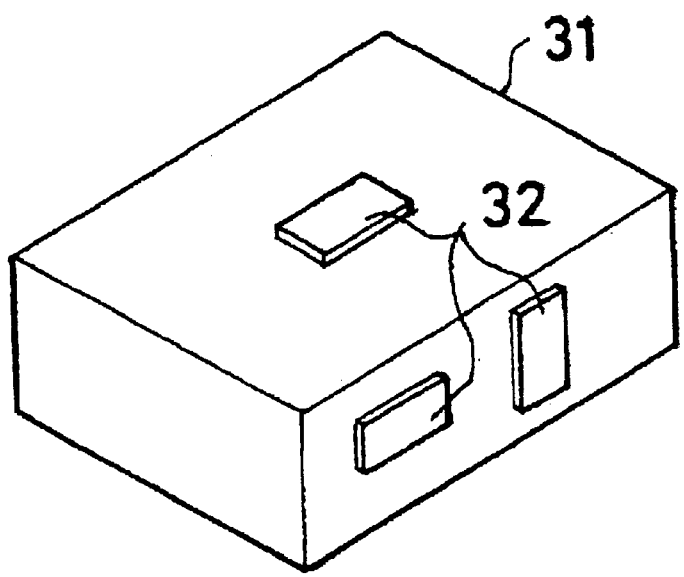
FIG. 9 (A) is a schematic perspective view showing the jig used for the drop impact test of the piezoelectric resonator and the positioning of the sample piezoelectric resonators on the jig.
FIG. 9(B) shows the impact directions on the sample piezoelectric resonator pieces.
Figure 9B:
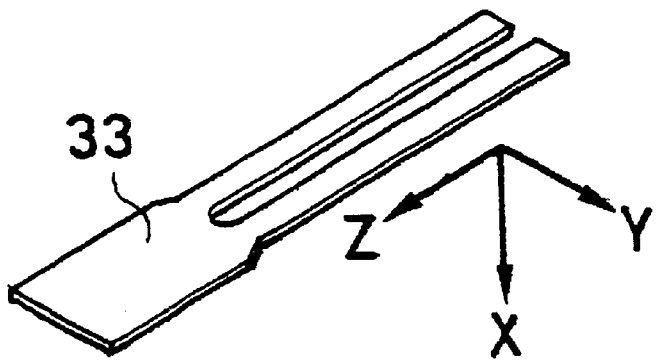

A drop impact test was performed for the tuning fork type quartz crystal resonator piece of FIG. 3 using the jig 31 shown in FIGS. 9(A)–(B). The jig 31 consists of a stainless steel rectangular parallelepiped having a predetermined weight. Three samples of tuning fork type quartz crystal resonator 32 were bonded on the upper face and one of the side faces of the rectangular parallelepiped, and were dropped from a certain height of, for instance, approximately 150 cm to the floor. As is shown in FIG. 9(A), one quartz crystal resonator 32 was on the upper face of the jig 31 and the other two were on the side face, one with its lengthwise side being horizontal and the other being vertical. In this way, the quartz crystal resonator piece 33 in each quartz crystal resonator 32 received an impact in the direction X, Y, or Z, respectively, orthogonal to one another. After the jig 31 was dropped several times, each quartz crystal resonator 32 was removed and its frequency was measured. Quartz crystal resonators having frequencies which deviated from a specified range ware regarded as a defective, and the defect incidence was calculated.

Figure 10:
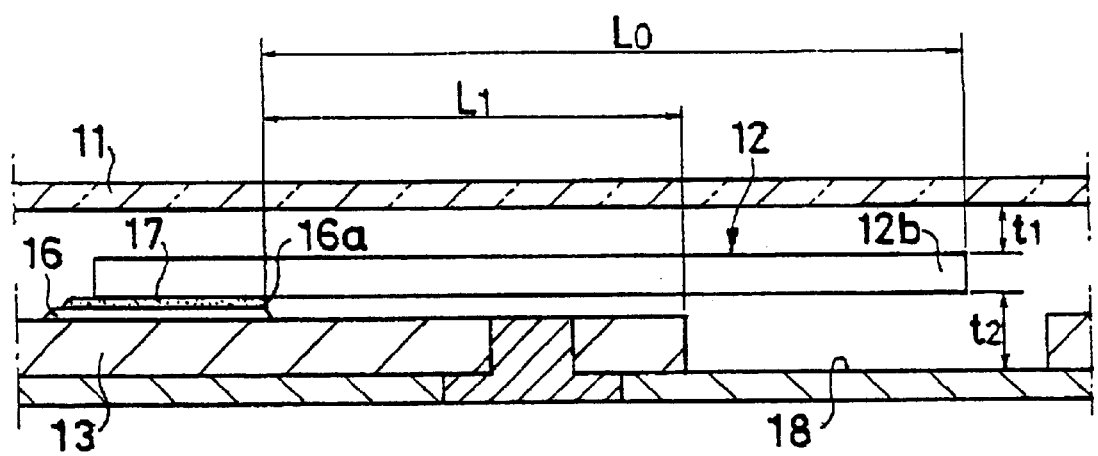
FIG. 10 is an enlarged sectional view showing the inner sizes of the sample package used in the drop impact test.
Figure 11:
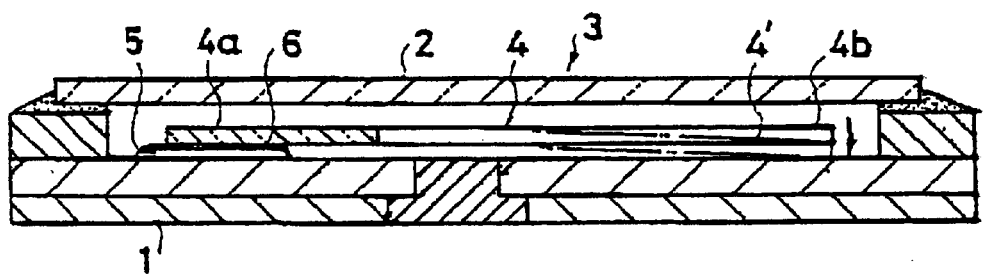
FIG. 11 is a vertical section showing the structure of a piezoelectric resonator according to a related art.

The size of the package for the tuning fork type quartz crystal resonator 32 is defined as shown in FIG. 10. In the horizontal direction, L0 is the distance between the leading edge of the electrode pads 16 on which the quartz crystal resonator piece 12 is fixed in a cantilever manner, that is, the fixed supporting point 16a of the quartz crystal resonator piece 12, and the tip of the free end 12b of the quartz crystal resonator piece, and L1 is the distance between the fixed supporting point 16a and the edge of the recess 18 which is on the side closest to the electrode pads. In the vertical direction, t1 is the gap between the quartz crystal resonator piece 12 supported horizontally and the lid 11, that is, the height to the lid 11 from the upper surface of the quartz crystal resonator piece 12, and t2 is the gap between the quartz crystal resonator piece 12 and the bottom surface of the recess 18, that is, the height to the lower surface of the quartz crystal resonator piece 12 from the bottom surface of the recess 18. A drop impact test was performed for many samples in which the electrode pads were 50 $\mu$m in height, the quartz crystal resonator piece was 100 $\mu$m in thickness, L0=3 mm, L1=1.5 mm, t1=100 $\mu$m, t2 varied from 50 to 150 $\mu$m. The defect incidence dramatically reduced when t2 exceeded 75 $\mu$m, and was nearly zero when t2≧80 $\mu$m, which confirmed the excellent resistance to impact.

The same drop impact test was performed for many samples in which the electrode pads were 50 $\mu$m in height, the quartz crystal resonator piece was 100 $\mu$m in thickness, L0=3 mm, t1=t2=100 $\mu$m, L1 varied 0.6 to 2.4 mm. The defect incidence dramatically reduced when L1 exceeded 1.2 mm, and was nearly zero when L1≧1.5 mm, which confirmed the excellent resistance to impact.

Assuming that the deflection rate of the quartz crystal resonator piece is constant because its stiffness is constant regardless of the size of L0, the test results obtained above resulted in the conclusion that the package structure according to the present invention will yield excellent resistance to impact when its inner sizes satisfy the expressions 0.5≦L1/L0<1 and t2/t1≧0.8.

The present invention is not confined to the tuning fork type quartz crystal resonator piece used in the embodiments above, and a variety of piezoelectric materials other than quartz crystal, such as lithium tantalate and lithium niobate, can be used. Any kind of surface mounting type piezoelectric resonator pieces which are mounted in a cantilever manner, such as rectangular, AT cut quartz crystal resonator, can be used as well.

As is apparent from the above description, the package structure for a piezoelectric resonator according to the present invention, in which a piezoelectric resonator piece is mounted with one end in a cantilever manner in the package using conductive adhesive, has a recess in the mounting surface of the base and/or the inner surface of the lid which is engaged with the base at the location adjacent to the free end of the piezoelectric resonator piece. This configuration prevents the free end from touching the inner surfaces of the package when the piezoelectric resonator piece is largely dislocated upward or downward upon external impact. Therefore, there is no risk of the tip or corner of the free end falling off and becoming re-depositing, which otherwise results in deterioration in the resonator properties. Furthermore, the reduced spaces between the piezoelectric resonator piece and both the mounting surface of the base and the inner surface of the lid contribute to the compactness and flatness in addition to the excellent resistance to impact.

What is claimed is:

1. A package structure for a piezoelectric resonator in which a piezoelectric resonator piece is mounted in a cantilever manner and hermetically sealed in said package, said package comprising:
    a base comprised of a top plate member and a bottom plate member and having a mounting surface on the top plate member provided with connection electrodes on which said piezoelectric resonator piece is mounted with one end in a cantilever manner using conductive adhesive;
    a wall member bonded to the top plate member of the base; and
    a lid engaged with the wall member and comprising a flat plate, at least one of the top plate member only of said base and the flat plate of said lid comprising a recess formed therein adjacent to a free end of said piezoelectric resonator piece.

2. The package structure for a piezoelectric resonator according to claim 1, said recess formed in said top plate member of said base having a slanted wall on a side closest to said connection electrodes.

3. The package structure for a piezoelectric resonator according to claim 1, said recess having a rectangular shape in its top view.

4. The package structure for a piezoelectric resonator according to claim 3, each corner of said rectangular shape being rounded.

5. The package structure for a piezoelectric resonator according to claim 1, said recess having an oval shape in its top view.

6. The package structure for a piezoelectric resonator according to claim 1, said recess having a track shape in its top view.

7. The package structure for a piezoelectric resonator according to claim 1, further comprising a communication channel provided through the base to permit application of a vacuum to an inside of said package.

8. The package structure for a piezoelectric resonator according to claim 1, said package having a size such that:
    0.5≦L1/L0<1,
    where L0 is a distance between a fixed support point and a free end tip of said piezoelectric resonator piece mounted on said connection electrode, and L1 is a distance between said fixed supporting point and an edge of said recess which is on a side closest to said connection electrodes, and
    t2/t1≧0.8,
    where t1 is a height to said lid from an upper surface of said piezoelectric resonator piece, and t2 is a height to said piezoelectric resonator piece from a bottom surface of said recess.

9. The package structure for a piezoelectric resonator according to claim 1, said piezoelectric resonator piece being a tuning fork type of piezoelectric resonator piece.

10. The package structure for a piezoelectric resonator according to claim 1, wherein the top plate member of the base is flat.

11. The package structure for a piezoelectric resonator according to claim 1, wherein the recess is formed in the top plate member of the base.

12. The package structure for a piezoelectric resonator according to claim 11, wherein the recess in the top plate member of the base is comprised of an opening in the top plate member at a location of the top plate member adjacent to the free end of the piezoelectric resonator piece.

13. The package structure for a piezoelectric resonator according to claim 1, wherein the recess is formed in the flat plate of the lid.

14. The package structure for a piezoelectric resonator according to claim 13, wherein the recess in the flat plate comprises a notch in the flat plate at a location of the flat plate adjacent to the free end of the piezoelectric resonator piece.

15. The package structure for a piezoelectric resonator according to claim 1, wherein the recess is formed in both the top plate member of the base and the flat plate of the lid.

* * * * *